(12) United States Patent
Johansson

(10) Patent No.: US 10,194,566 B2
(45) Date of Patent: Jan. 29, 2019

(54) FEED-THROUGH

(71) Applicant: HANS-ERIK JOHANSSON I HAGSTAD AKTIEBOLAG, Gnosjö (SE)

(72) Inventor: Hans-Erik Johansson, Gnosjö (SE)

(73) Assignee: HANS-ERIK JOHANSSON I HAGSTAD AKTIEBOLAG (SE)

( * ) Notice: Subject to any disclaimer, the term of this patent is extended or adjusted under 35 U.S.C. 154(b) by 0 days.

(21) Appl. No.: 15/529,469

(22) PCT Filed: Dec. 17, 2015

(86) PCT No.: PCT/EP2015/080208
§ 371 (c)(1),
(2) Date: May 24, 2017

(87) PCT Pub. No.: WO2016/097137
PCT Pub. Date: Jun. 23, 2016

(65) Prior Publication Data
US 2017/0303446 A1    Oct. 19, 2017

(30) Foreign Application Priority Data

Dec. 19, 2014  (SE) ........................ 1451594
Jan. 20, 2015  (SE) ........................ 1550044

(51) Int. Cl.
*H05K 9/00*   (2006.01)
(52) U.S. Cl.
CPC ......... *H05K 9/0018* (2013.01); *H05K 9/0098* (2013.01); *H05K 9/0007* (2013.01); *H05K 9/0049* (2013.01); *H05K 9/0081* (2013.01)

(58) Field of Classification Search
CPC .................................................. H05K 9/0018
See application file for complete search history.

(56) References Cited

U.S. PATENT DOCUMENTS

| | | |
|---|---|---|
| 3,830,954 A | 8/1974 | Caudill |
| 4,148,543 A | 4/1979 | Shores |
| 4,677,253 A | 6/1987 | Blomqvist |
| 4,733,016 A * | 3/1988 | Twist ........................ F16L 5/08 |
| | | 174/657 |

(Continued)

FOREIGN PATENT DOCUMENTS

| | | |
|---|---|---|
| DE | 37 11 937 C1 | 7/1988 |
| DE | 40 13 886 A1 | 10/1991 |

(Continued)

*Primary Examiner* — Hung V Ngo
(74) *Attorney, Agent, or Firm* — Condo Roccia Koptiw LLP

(57) ABSTRACT

A feed-through provides electromagnetic shielding where one or more signal leads pass through an enclosure. It comprises a frame, having at least one opening, and an assembly comprising two or more joining parts, forming one or more elongated waveguides. The joining parts are divisible along the length of the waveguides, thereby being capable of surrounding a signal lead. The assembly is adapted to be attached to the frame such that one or more signal leads can pass through an opening in the frame and through one of the waveguides. Installation is of the feed-through is made easier by the opening in the frame having a larger maximum extension than the maximum extension of a waveguide.

24 Claims, 12 Drawing Sheets

(56) References Cited

U.S. PATENT DOCUMENTS

| | | | |
|---|---|---|---|
| 4,849,723 A | 7/1989 | Oliver, Jr. | |
| 5,416,271 A * | 5/1995 | Birmingham | F16L 5/08 174/657 |
| 5,938,152 A * | 8/1999 | Kreutz | F16L 5/08 174/656 |
| 6,262,370 B1 | 7/2001 | Kreutz | |
| 6,713,672 B1 | 3/2004 | Stickney | |
| 7,793,415 B2 | 9/2010 | Vitt et al. | |
| 8,674,240 B2 * | 3/2014 | Karlsson | F16L 5/08 174/652 |
| 2003/0042032 A1 * | 3/2003 | Syed | H02G 3/0481 174/36 |
| 2007/0209832 A1 * | 9/2007 | Ball | H05K 9/0067 174/370 |
| 2009/0194644 A1 | 8/2009 | Lundborg | |
| 2009/0257198 A1 * | 10/2009 | Rogers | H05K 5/023 361/726 |
| 2010/0001476 A1 * | 1/2010 | Broder | F16L 5/08 277/606 |
| 2010/0154325 A1 * | 6/2010 | Boesel | H05K 9/0018 52/173.1 |

FOREIGN PATENT DOCUMENTS

| | | |
|---|---|---|
| EP | 0 293 042 A1 | 11/1988 |
| FR | 2 611 333 B1 | 8/1988 |
| SE | 441 795 B | 11/1985 |
| SE | 508 755 C2 | 11/1998 |
| SE | 528 689 C2 | 1/2007 |
| WO | WO 99/34537 | 7/1999 |
| WO | WO 99/45619 A1 | 9/1999 |

* cited by examiner

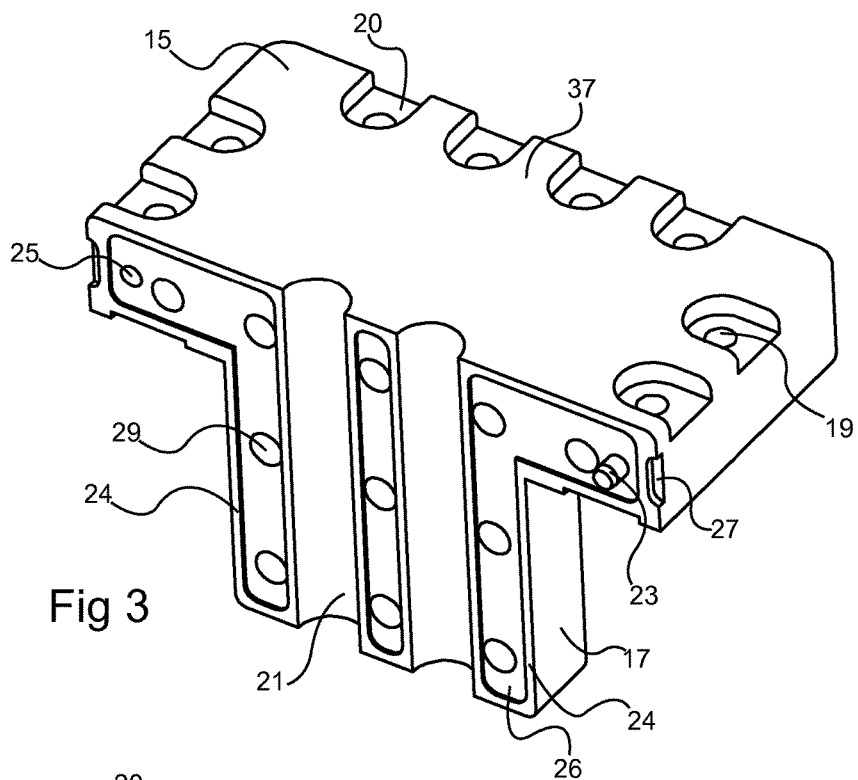
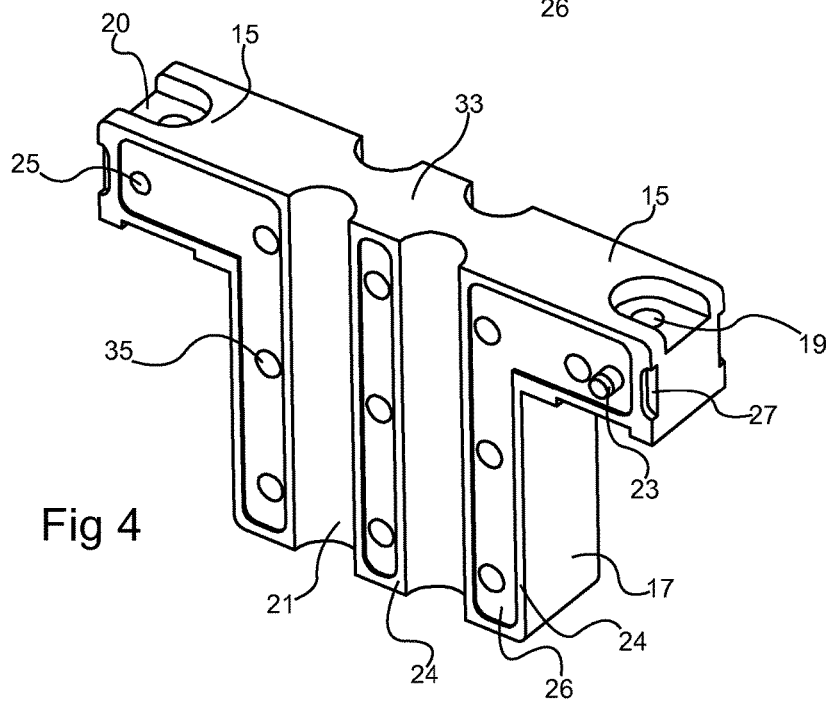

FEED-THROUGH

CROSS REFERENCE TO RELATED APPLICATIONS

This application is the National Stage Entry under 35 U.S.C. § 371 of Patent Cooperation Treaty Application No. PCT/EP2015/080208, filed 17 Dec. 2015, which claims the benefit of Sweden Application No. 1550044-0, filed 20 Jan. 2015, and Sweden Application No. 1451594-4, filed 19 Dec. 2014, the disclosures of which are incorporated herein by reference in their entireties.

TECHNICAL FIELD

The present invention relates to a feed-through for providing electromagnetic shielding where one or more signal leads pass through a cabinet or other enclosure.

BACKGROUND

Such a feed-through can be used to prevent emission of electromagnetic waves, for example to avoid electromagnetic interference or the leakage of critical information from a network switch or server placed in a cabinet or enclosure. For the latter application, standards, usually referred to using the term "TEMPEST", are established that require attenuation up to the order of 100 dB at frequencies up to 10 GHz at the feed-through.

One example of such a feed-through, for optical cables, is described in U.S. Pat. No. 7,793,415-B2, which shows a flat member with a number of openings. An enclosure can be fitted around each cable to form a tube, and this tube can be attached to the flat member at an opening thereof. The flat member is in turn attached to an opening of a cabinet or other enclosure. This structure reduces electromagnetic interference to a desired level up to a frequency that is determined by the length and the inner diameter of the tube formed by the enclosure.

One problem associated with such a feed-through is how to facilitate installation of, for example, optical cables in a cabinet or other enclosure where the feed-through is used.

SUMMARY

One object of the present invention is therefore how to facilitate installation of, for example, optical cables in cabinets or other enclosures where the feed-through is used.

This object is achieved by means of a feed-through as defined in claim 1. More specifically, such a feed through comprises a frame, having at least one opening, and at least one assembly comprising two or more joining parts, forming one or more elongated waveguides. The joining parts are divisible along the length of the waveguides, thereby being capable of surrounding a signal lead. The assembly is adapted to be attached to the frame such that one or more signal leads can pass through an opening in the frame and through one of the waveguides. Further, the opening in the frame then has a larger maximum extension than the maximum cross section extension of a waveguide.

With such a feed-through it is possible, while providing a reasonably short waveguide with a small diameter, to install, for example, a pre-terminated fiber-optic cable, i.e., one that has already been provided with a connector, which has a considerably greater cross section than a fiber-optic cable. The frame may be attached to a cabinet or other enclosure, and the user may stick the fiber-optic cable, or a bundle of cables, with a connector at its end, through the opening in the frame, which opening is large enough to allow this. The joining parts are then fitted around the cable or cables such that the cables run in an elongated cavity in the interior of the finished assembly. This can be achieved even in cases where the cavity is narrower than the connector. Means for attaching the parts together are provided. The enclosing parts are then firmly connected to the frame. Thereby pre-terminated cables can be used, which makes any installation procedure considerably more efficient.

The number of cables that need to be fed through a cabinet wall may vary greatly between different applications. One way to achieve flexibility in the number of cables possible to be fed though is to let the assembly consist of a variable number of parts, with a variable number of optional middle parts between two end parts. Installation is facilitated by the completed assembly forming one solid block without extending and/or fragile parts.

Machined parts allowing high precision may be used, making a tight fit between the parts possible, thus preventing the leakage of electromagnetic radiation between the parts. The frame may be welded to the cabinet to prevent leakage of radiation between the frame and the cabinet. A frame with a thickness larger than 10 mm may be used in order to facilitate welding. An electrically conductive gasket, such as a copper-beryllium gasket, can be used to prevent leakage of electromagnetic radiation between the assembly and the frame. The parts in the assembly may be made from steel, which has good conductive properties, resulting in a well-functioning waveguide. Tying the parts together using nuts and bolts is one way to assure tight electric contact between them.

In general, the longer a waveguide is, the larger the attenuation will be. In addition, for a waveguide to be able to attenuate a given frequency, that frequency needs to be below the cut-off frequency of the waveguide. Standards as discussed above mandate a certain minimum attenuation, leading to waveguides needing to have a certain minimum length and maximum transversal extension. In this case, the waveguides may have length of at least 52 mm and/or a maximal transversal extension of at most 17.5 mm.

On the connecting surfaces between joining parts, there may be recesses, the use of which may result in good electric and mechanical contact between the parts.

Space is often tight in and around cabinets of the mentioned kind. Allowing the waveguides to extend through the opening in the cabinet is one way of saving space. In particular, more space is often available outside of the cabinet. A configuration wherein the feed-through extends further on the outside than on the inside of the cabinet will make better use of available space.

Handles may be placed on any of the parts of the assembly to aid installation and removal. To aid installation, the frame may comprise one or more detachable parts. Furthermore, the frame may be comprised of two or more layers that may attach to each of the walls of a cabinet having several walls.

Different waveguides may be of different lengths according to need, for example to save space and material. The signal lead going through the feed-through is typically a fiber-optic cable.

The object mentioned in the first paragraph may also be achieved by means of a system, comprising the mentioned feed-through, a cabinet or enclosure, and one or more signal leads.

BRIEF DESCRIPTION OF THE DRAWINGS

These and other aspects of the invention will now be described in more detail, with reference to embodiments of the invention.

FIG. 3 is a perspective drawing of an end part of an assembly.

FIG. 4 is a perspective drawing of a middle part of the assembly.

FIG. 8 is a perspective drawing showing one side of an installed feed-through.

FIG. 9 is a perspective drawing showing another side of an installed feed-through.

DETAILED DESCRIPTION

Figure 1:
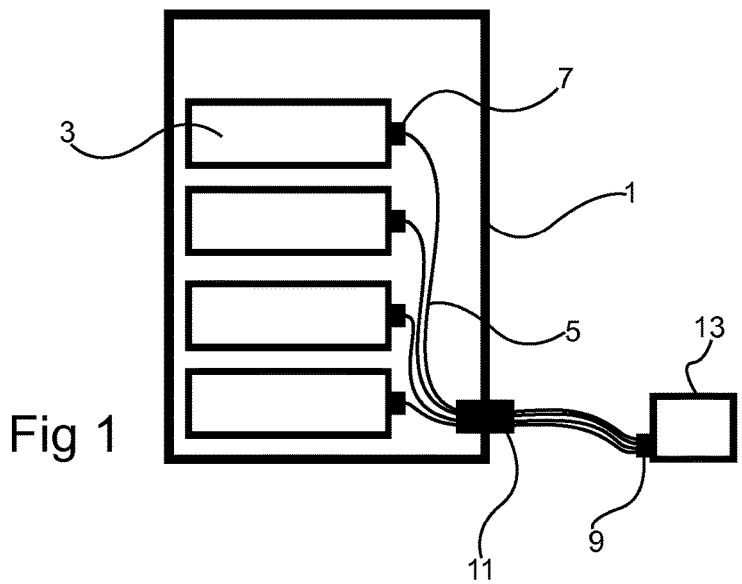
FIG. 1 schematically illustrates a situation where a feed-through according to the present disclosure can be used.

FIG. 1 illustrates a protected cabinet or other enclosure 1, which is a context where a feed-through 11 according to the present disclosure can be used. Such a cabinet or other enclosure can be used in a sensitive environment where processing devices 3 in the cabinet 1, such as servers, electronically process unencrypted sensitive information. The cabinet 1, which may be made of thick sheet metal, functions as a Faraday cage, containing within its enclosure any electromagnetic radiation from the processing devices 3, thereby preventing the leakage of sensitive information. The processing devices 3 communicate with nodes 13 outside the cabinet 1 via optical fibers 5 which are terminated by means of connectors 7, 9 at each end. The optical fibers may convey less sensitive information or the information carried by them may be encrypted. Furthermore, the conveyed optical signals as such usually give negligible leaked radiation, preventing interception of such signals, unless the fibers are tampered with.

The feed-through where the optical fibers extend out of the cabinet 1 requires special attention so that electromagnetic radiation does not escape the cabinet, risking interception by a third party nearby.

In addition to the shielding situation described above, the feed-through may be useful in other situations where considerable attenuation at a connection into a Faraday cage is needed. For instance, as the effect provided is more or less reciprocal, the feed-trough could protect sensitive equipment in a cabinet from external electromagnetic interference, such as electromagnetic pulses with high energy. Further, a shielded room used for sensitive measurements could be protected from external electromagnetic interference, etc.

Figure 2:
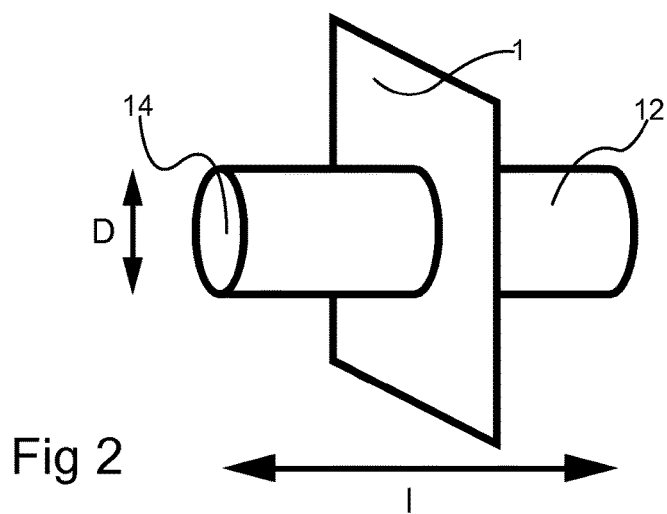
FIG. 2 schematically illustrates a waveguide below-cut-off.

As is well known per se, an attenuating feed-through can be obtained by means of a waveguide below-cutoff, WBCO, of which one example is schematically illustrated in FIG. 2. In this example the waveguide 12, made from a conductive material, has a cavity 14, open at both ends, with a circular cross section with diameter D and a length l. The waveguide extends through a wall in a Faraday cage 1.

Electromagnetic waves can propagate through a waveguide in a number of different modes, corresponding to different solutions to the Maxwell equations. These modes are distinguished by different configurations of the electric and magnetic fields. Each of these modes has a cut-off frequency, below which no substantial propagation in that mode is possible. Below the lowest cut-off frequency of all possible modes, no substantial propagation of electromagnetic waves is possible at all. Instead, signals suffer exponential attenuation. In a circular waveguide, the mode with the lowest cut-off frequency is the $TE_{11}$ (transverse electric) mode. The cut-off frequency $f_c$ of that mode can be shown to be, to three significant figures, $$f_c = \frac{0.586\,v}{D},$$

where v is the propagation speed of the waveguide dielectric, i.e., the nonconductive material forming the bulk of the waveguide cavity. In air, v is to a good approximation $3 \times 10^8$ m/s. Below this cut-off frequency, over a distance l, an electromagnetic wave with frequency f suffers a total attenuation of, again to three significant figures, $$A = 32.0 \frac{l}{D} \sqrt{1 - \left(\frac{f}{f_c}\right)^2}\ \text{dB}.$$

It can thus easily be realized that to maximize attenuation of signals of a certain frequency requires as high a cut-off frequency as possible, and thus as narrow a waveguide as possible, as well as a long a waveguide as possible. It can also be seen that the larger the diameter a waveguide has, the longer the waveguide needs to be to achieve target attenuation.

For a feed-though to function properly according to the strictest current standards, i.e. a dampening of 100 dB between frequencies 10 kHz and 10 GHz, the cross-section diameter of a waveguide should preferably be smaller than about 17.5 mm. With an example cross-section diameter of 12 mm, a waveguide should preferably be longer than about 52 mm.

Figure 5:
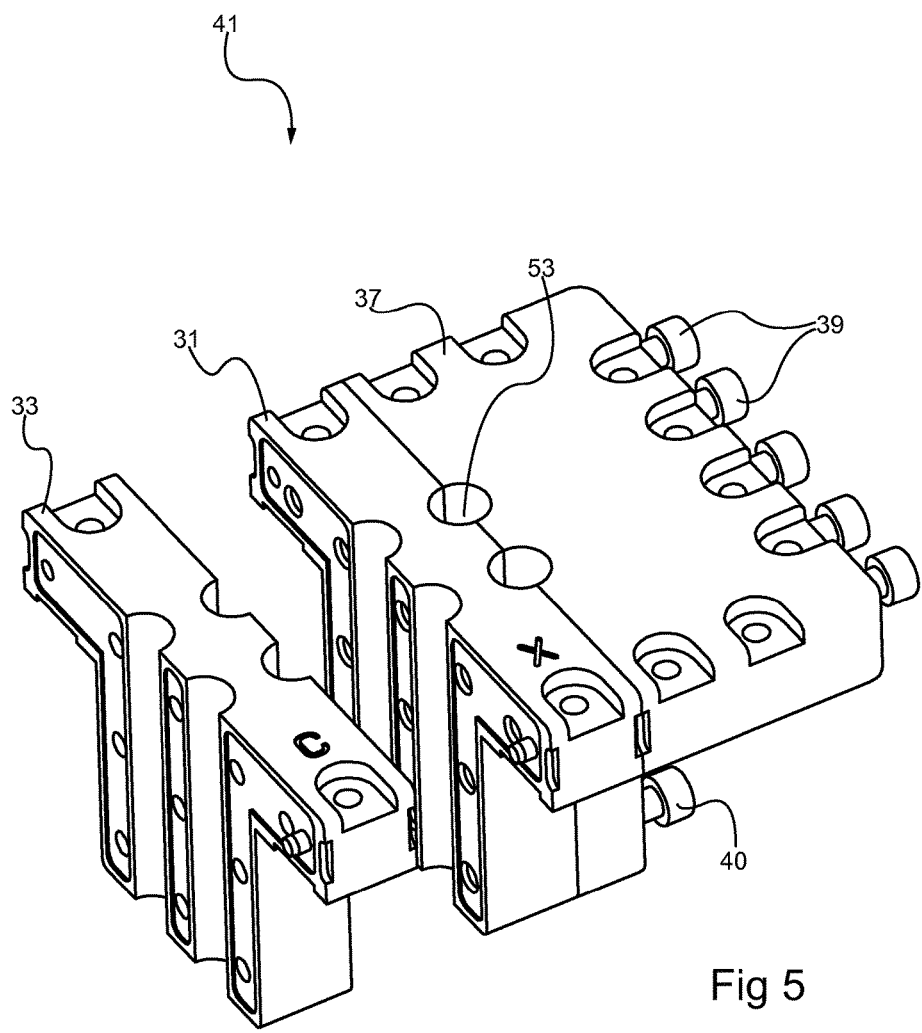
FIG. 5 is a perspective drawing showing how the parts of the assembly fit together.
Figure 6:
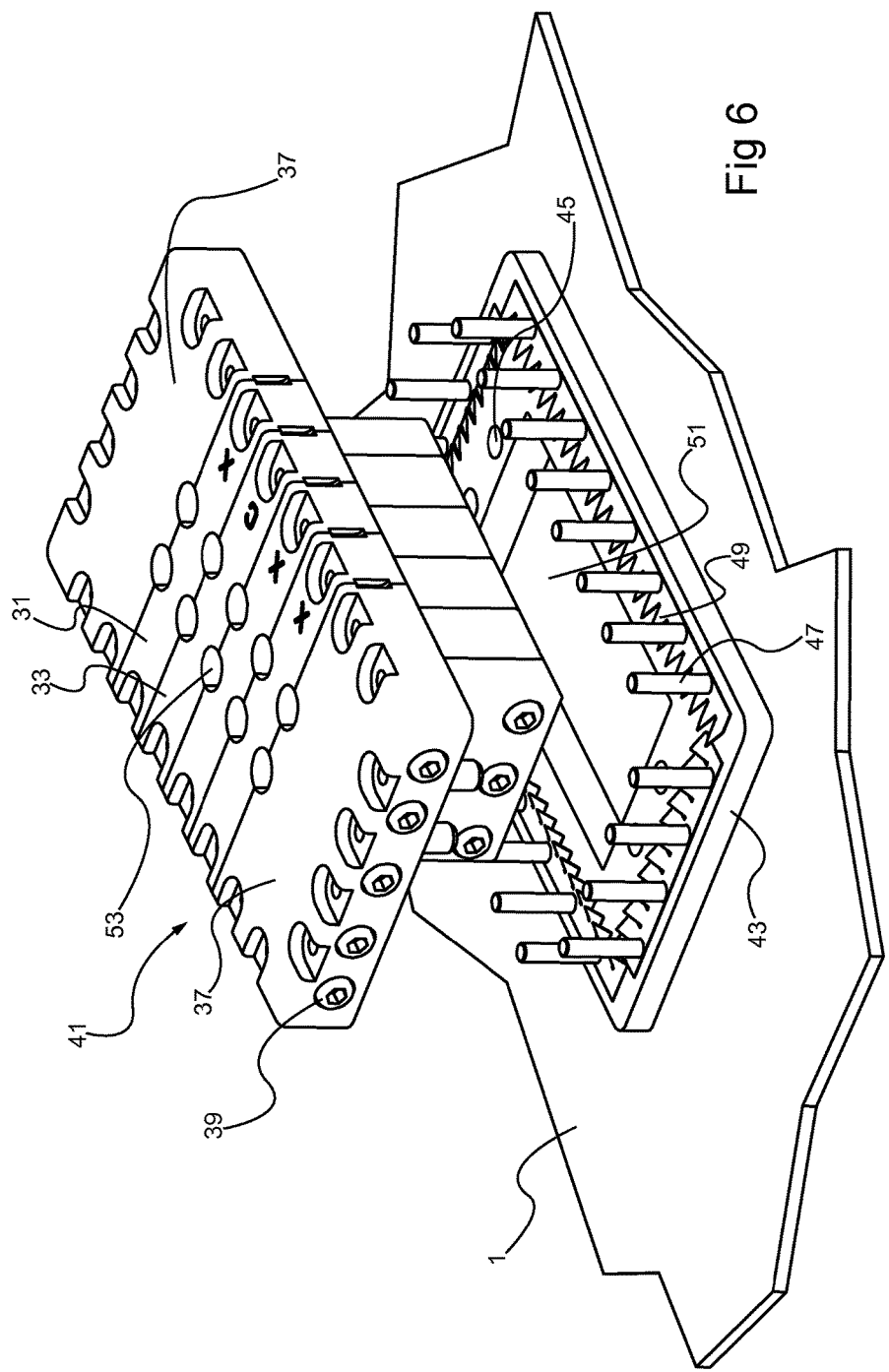
FIG. 6 is a perspective drawing showing a view of a completed assembly and how the assembly is attached to the frame.

FIG. 6 shows the parts of a complete feed-through. The feed-though comprises a frame 43 and an assembly 41, the latter comprising two end parts 37 and between them, optionally, one or more middle parts 31, 33. FIG. 5 shows how the parts of the assembly fit together. As the parts comprising the assembly are brought together, waveguides 53 are formed from cut-outs on those parts. A minimal configuration of the assembly 41 could consist of only two end parts 37. Any number of middle parts 31, 33 can then be placed between them according to need. Middle parts 31, 33 can be made slightly different, e.g. with 33 or without 31 threads. Middle parts with threads 33 are on the drawings marked "C", while those without threads 31 are marked "X". This arrangement allows a tight fit between the parts. At the same time, the finished assembly is rugged without any extending fragile parts and not likely to break apart during installation. The completed assembly 41 as shown in FIG. 6 fits into an opening 51 of the frame 43.

In the embodiment described here, the parts of the assembly are made from steel, which material has good electric conducting properties, allowing for a well-functioning waveguide. Machined parts are used, which allows high precision, allowing for a tight fit between the parts. However, the skilled person realizes that other fabrication methods and other materials with good electrical conductivity are also possible.

An electrically conducting gasket, such as a copper-beryllium gasket 49 may be used to prevent leakage of electromagnetic radiation between the assembly 41 and the frame 43. Copper-beryllium gaskets are rugged and easy to use.

A person skilled in the art realizes that other arrangements, such as an arrangement of conductive gaskets made from, for example, silicone or rubber mixtures, lying flat on the frame 43 or running in one or more grooves in the frame, are conceivable as well.

FIGS. 3 and 4 show different parts making up the assembly 41 (cf. FIG. 6); an end part 37, and one example of a middle part 33. As mentioned above, there may be provided middle parts with holes 35 having threads, and middle parts 31 (cf. FIG. 5) with corresponding holes not having threads.

An end part 37 comprises a flange portion 15 and a protruding section 17 perpendicular to the flange. A middle part 31, 33 comprises two flange portions 15 and one protruding section 17.

The flanges 15 are devised to be attached to the frame 43 (cf. FIG. 6). On each middle part 31, 33, one flange portion 15 is located on each side of the protruding portion. On the flanges 15, there are holes 19 in a direction perpendicular to the flanges 15, extending through the flanges. These holes 19 are suitable for attaching the assembly 41 to the frame 43. In the particular embodiment of the disclosure described here, middle parts 31, 33 have one such hole 19 on each flange, while an end part 37 has four holes 19 on the edge of the flange facing away from the protruding section 17 and two holes 19 on each of the two edges perpendicular to the edge facing away from the protruding section 17. At the entrance to each hole 19, there may be a recess 20 suitable for giving space for a nut.

On the protruding section 17 on both end parts 37 and middle parts 31, 33, there are connecting surfaces 24 that will be in contact as the parts of the assembly are brought together. On the middle parts 31, 33 there are such surfaces on each side of the protruding section 17 and flanges, while on end parts 37, there are such surfaces only on a side of the protruding section 17 facing away from the flange 15. The peripheries of these surfaces may be raised, such that there is provided recesses 26 there between, where holes 29, 35 for bolts are provided, in order to improve mechanical/galvanic contact between the surfaces of different parts by permitting higher pressure at the contact surfaces 24. In the embodiment described here, such raised edges are present on the middle parts 31, 33, as well as on the end parts 37.

At the connecting surfaces described above, there are cut-outs 21 that, when matched with corresponding middle 31, 33 or end parts 37, form the waveguides. In the embodiment described here, there are two such cut-outs at each connecting surface. The cut-outs extend along the whole length of the parts 31, 33, 37.

In the embodiment described here, the cut-outs are semi-circular. However, a person skilled in the art realizes that cut-outs of other shapes, such as quadratic, rectangular, honeycomb or general polygon shaped are equally possible. A person skilled in the art would additionally recognize that it is equally possible to have a different number of cut-outs than two on the surfaces of the parts and to have cutouts that for one waveguide have different cut-outs on the two different parts forming that waveguide.

Additionally, on the connecting surfaces described above, there may be pins 23 and holes 25 to aid alignment of end parts 37 and/or middle parts 31, 33 attaching to each other. In the embodiment described here, those pins 23 and holes 25 are located on the flanges 15, near the end of the connecting surfaces. Just outside of the pins 23 and holes 25, on the edge between the flange 15 and the connecting surface, there may be smaller cut-outs 27, designed to aid disassembly, if desired, for example by inserting a screwdriver into the cut-out 27 and turning the screwdriver and/or using it as a lever.

In the recesses at the connecting surfaces described above, there are through holes 29 extending perpendicularly to the surfaces, in the protruding sections 17 and the flanges 15. In the embodiment described here, on the middle parts 31, 33, there is one such hole 29 through each of the flanges 15. On end parts 37, there is one such hole 29 though each side of the flange 15. On both end 27 and middle 31, 33 parts, there are three rows of holes 29 extending though the protruding section 17. One such row is located on one side of the two cuts-outs 21, one row on the other side of the cut-outs 21 and one row between the cut-outs 21. The number of holes 29 in each row depends on the length of the protruding section 17. In the embodiment described here, each row has three holes 29. Needless to say, the hole configurations may be varied in a number of ways.

On middle parts 31, 33, the holes described in the previous paragraph may be threaded 33 or be without threads 31.

FIG. 5 shows how the assembly 41 is fitted together, here exemplified with an end part 37, a middle part 31 without threads, and a middle part 33 with threads being attached to each other using bolts 39, 40. The bolts may interact with the threads 35 (cf. FIG. 4) of middle parts 33 having such threads or with nuts if the bolts penetrate the entire assembly. Thereby the parts are compressed, bringing the connecting surfaces described above into close contact. The skilled person will recognize that other means for applying this pressure than bolts and optional nuts are possible.

As already has been discussed, FIG. 6 shows a completed assembly 41, the frame 43, and a wall of the cabinet 1. The frame 43 can have a rectangular cross section and an opening 51, also rectangular in cross-section, where the narrower part of the assembly 41 fits, i.e., the part of the assembly comprised of the protruding sections 17 of the parts 31, 33, 37 making up the assembly. The frame may for example have been welded to the cabinet, although other ways of fitting the frame to the wall are conceivable. To be suitable for welding to the cabinet 1, it may be beneficial for the frame 43 to have a thickness in a direction perpendicular to the plane of one side of the cabinet of at least 10 mm.

In the embodiment described here, the waveguides 53 formed by the joining parts 31, 33, 37 are at a right angle to the plane of the frame 43 or of one side of the cabinet 1. However, it is equally possible for the waveguides 53 and the protruding sections 17 of the joining parts 31, 33, 37 to be at an oblique angle to the flanges 15, resulting in a feed-though with signal leads 5 entering the cabinet 1 at an oblique angle with respect to the plane of the frame 43 or of one side of the cabinet 1. This may have an advantage of saving space inside the cabinet.

When the assembly has been put together, with leads in the waveguides, the assembly is fitted in the frame and firmly attached to the frame.

Threaded bolts 47 attached to the frame 43 match holes in the flanges 15 of the parts comprising the assembly 41. These bolts may for example have been press fitted into the frame. A set of holes 45, in the embodiment described two holes along each short side of the opening 51 in the frame 43, extend through the frame 43 and through the cabinet 1.

Figure 7:
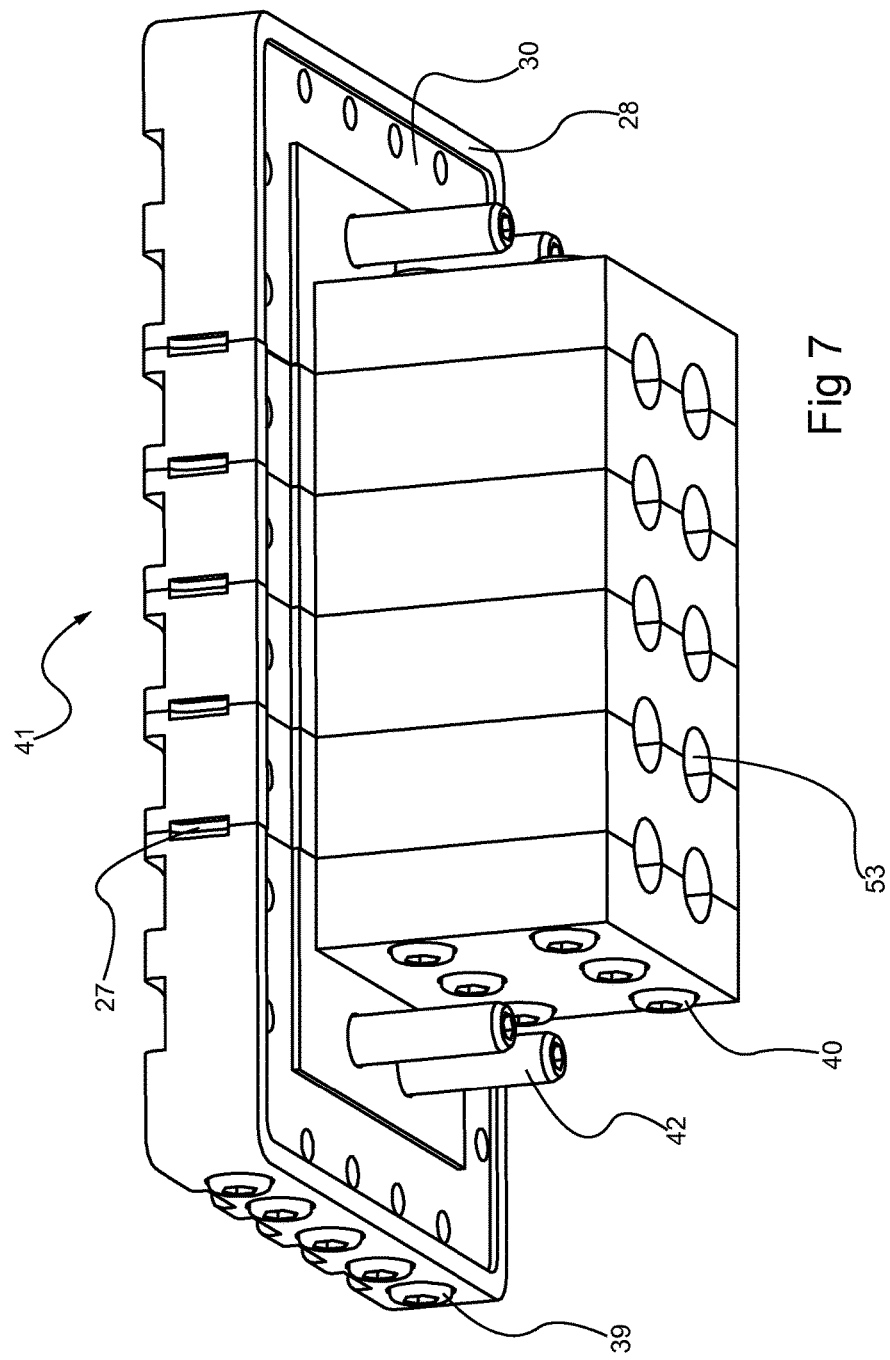
FIG. 7 is a perspective drawing showing another view of a completed assembly.

FIG. 7 shows another side of a completed assembly 41. Bolts 39, 40 attaching the parts together are present both through the flanges and through the protruding parts. Another set of bolts 42, hidden in FIG. 3, in the embodiment described two bolts 42 on each side, are attached to the end parts on the flange 15 close to the protruding section 17. These bolts 42 match the holes 45 in the frame described above. Attaching the assembly with bolts from both sides of the cabinet 1 makes the feed-though more tamper-resistant and make unauthorized access to the cabinet though the feed-through more difficult.

The assembly 41 as illustrated has contact surfaces 28 beneath the flanges. These contact surfaces 28 are devised to come into close contact with corresponding surfaces on the frame 43, optionally with an intervening gasket 49. These contact surfaces as well may have recessed portions 30 as well, in order to leave space for a gasket 49.

Figure 8:
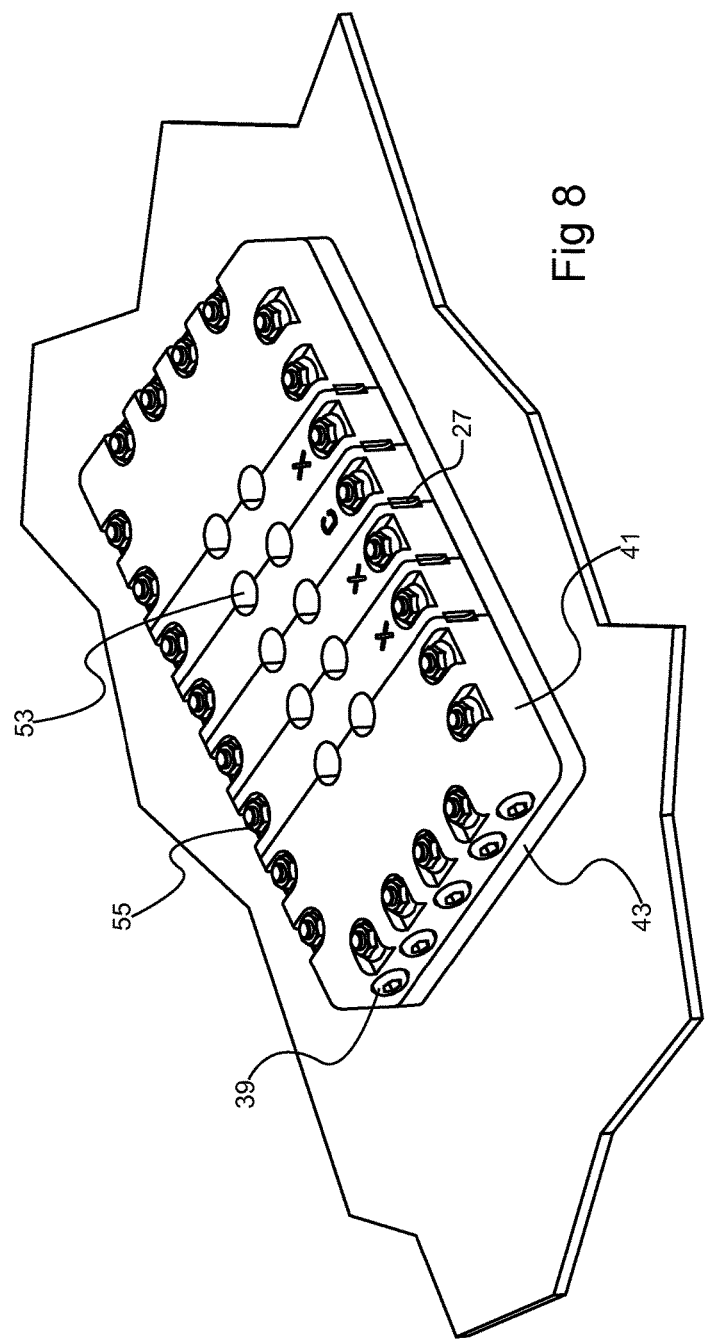

FIG. 8 shows one side of a complete feed-through, with the completed assembly 41 attached to the frame 43. Nuts 55 may attach to the bolts 47 attached to the frame 43.

Figure 9:
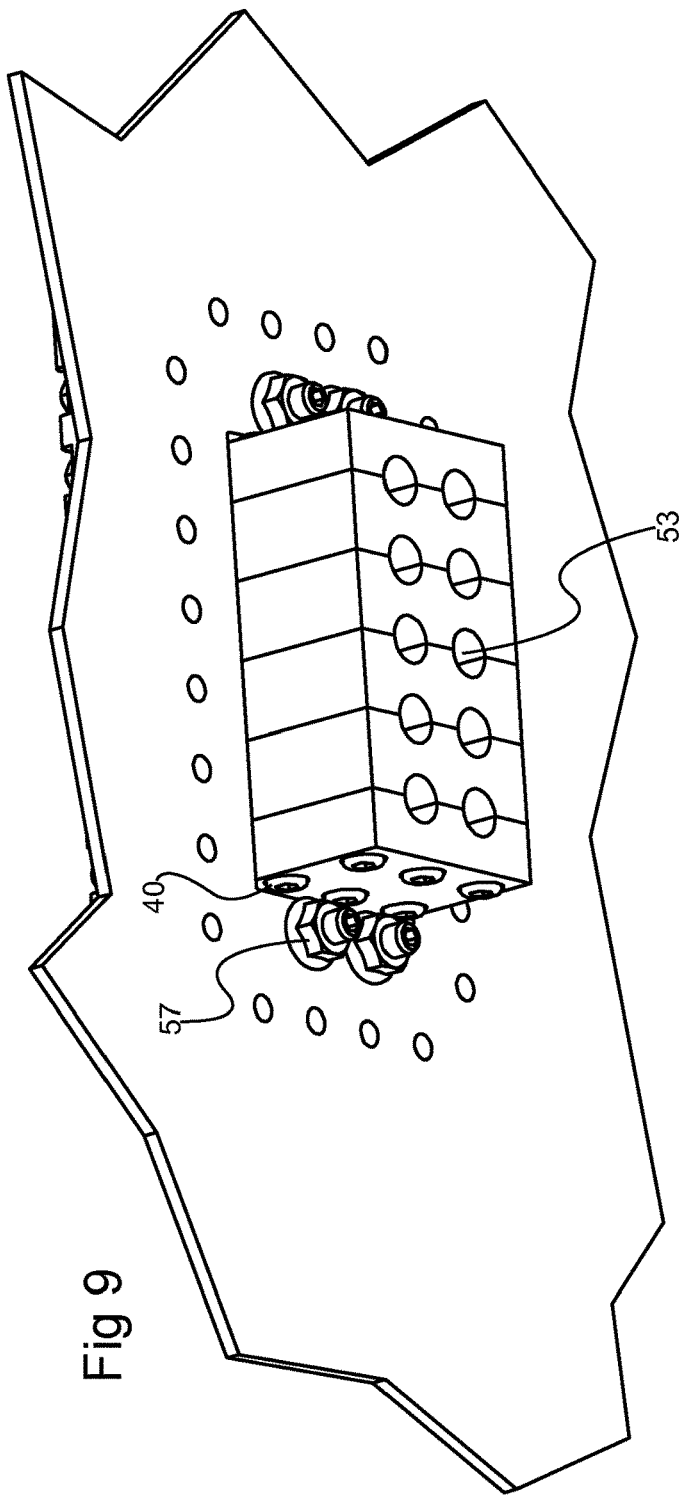

FIG. 9 shows the other side of a complete feed-through. Nuts 57 may attach to the bolts 42 attached to the end parts.

Figure 10:
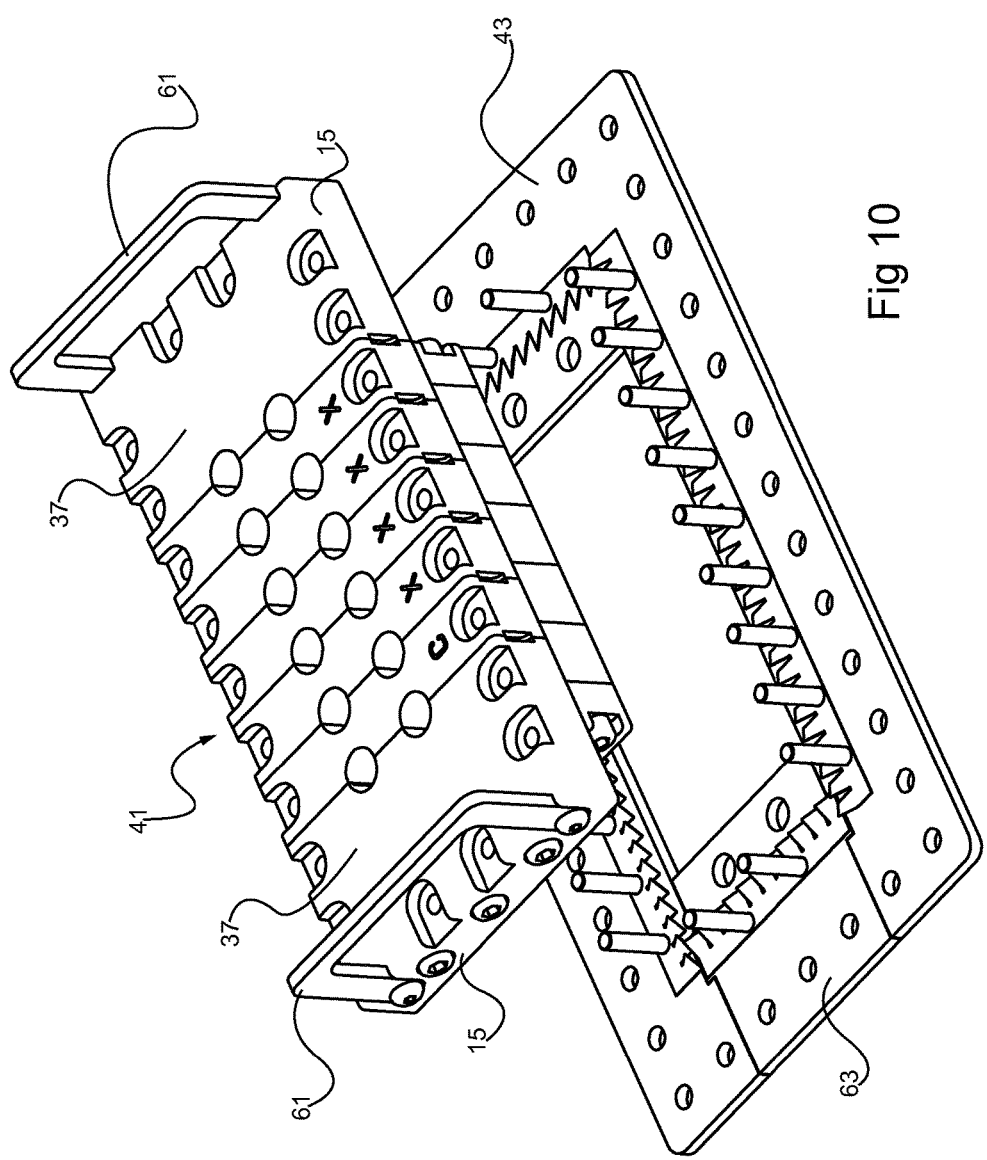
FIG. 10 is a perspective drawing showing an embodiment of the invention in which the assembly has handles and the frame has a detachable part.

FIG. 10 shows an embodiment of the invention in which the assembly 41 has handles 61 and the frame 43 has a detachable part 63. In this embodiment, the handles are mounted at each end of the assembly 41, on the edges of the flanges 15 of the end parts of the assembly 41. The handles are mounted using screws, and facilitate the handling of the assembly. Other locations of the handles and ways of mounting them are equally possible.

The detachable part 63 of the frame 43 is located by one short edge of the frame and may aid installation of the feed-through. For instance it is possible to fit the frame around a pre-installed set of cables, and thereafter close the frame with the separate, detachable part. The frame is then attached to the enclosure wall. It is also possible to use a fame structure on both sides of a wall. The detachable part 63 may thus be a cut-out from the frame, for instance with stepped shape to reduce any electormagnetic leaks.

Figure 11:
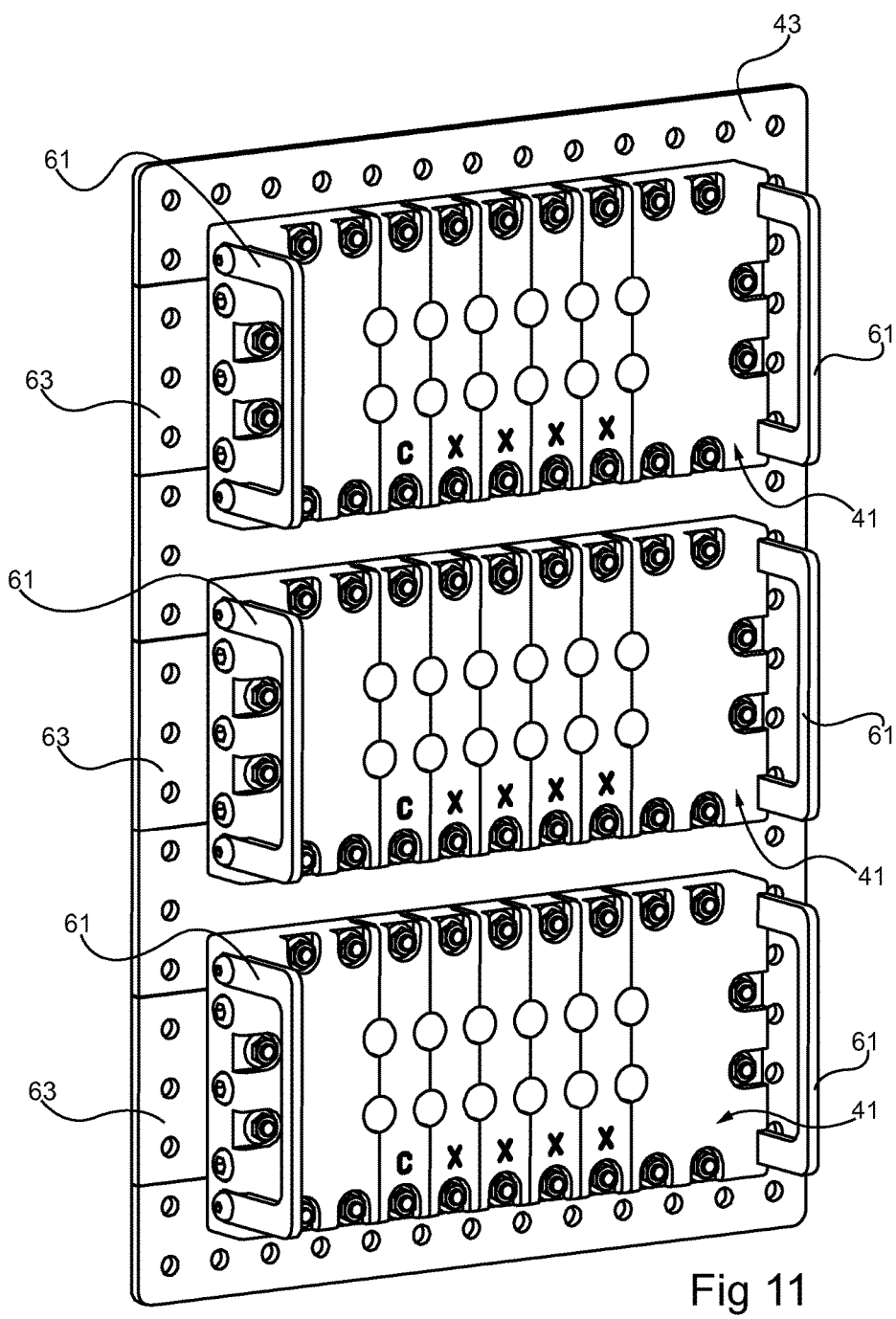
FIG. 11 is a perspective drawing showing an embodiment of the invention in which several assemblies are mounted on one frame and each assembly has handles.

FIG. 11 shows an embodiment of the invention in which several assemblies 41, in this case three, are mounted on one frame 43. Each assembly 41 has handles 61. The handles 61 are mounted on the assemblies 41 in the same way as in the embodiment depicted in FIG. 10. Each assembly 41 is mounted in its own opening of the frame. Removable parts 63 of the frame 43 are located adjacent to a short edge of each assembly 43 and may aid installation of the feed-through.

Figure 12:
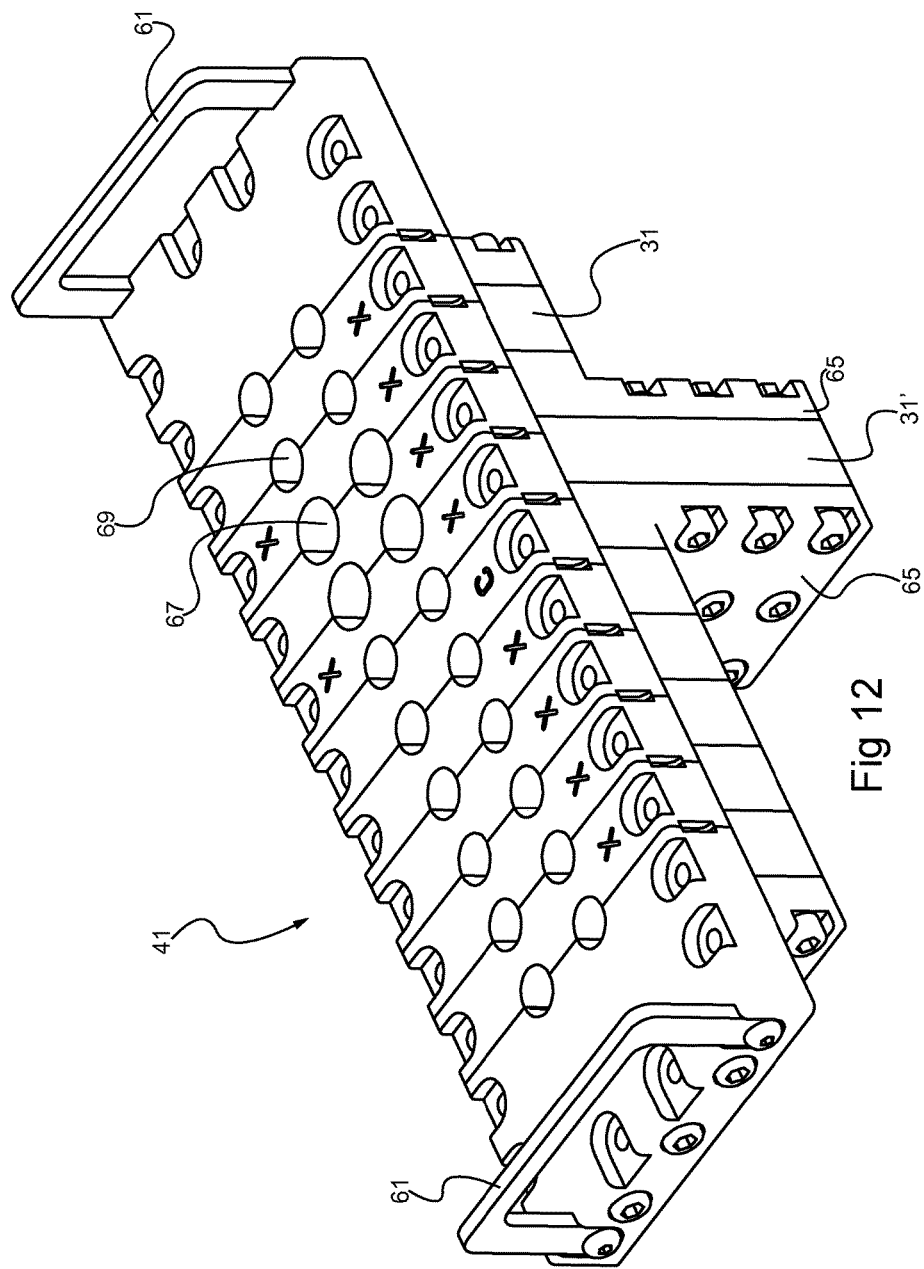
FIG. 12 is a perspective drawing showing one side of an assembly in an embodiment of the invention where the waveguides have different lengths.
Figure 13:
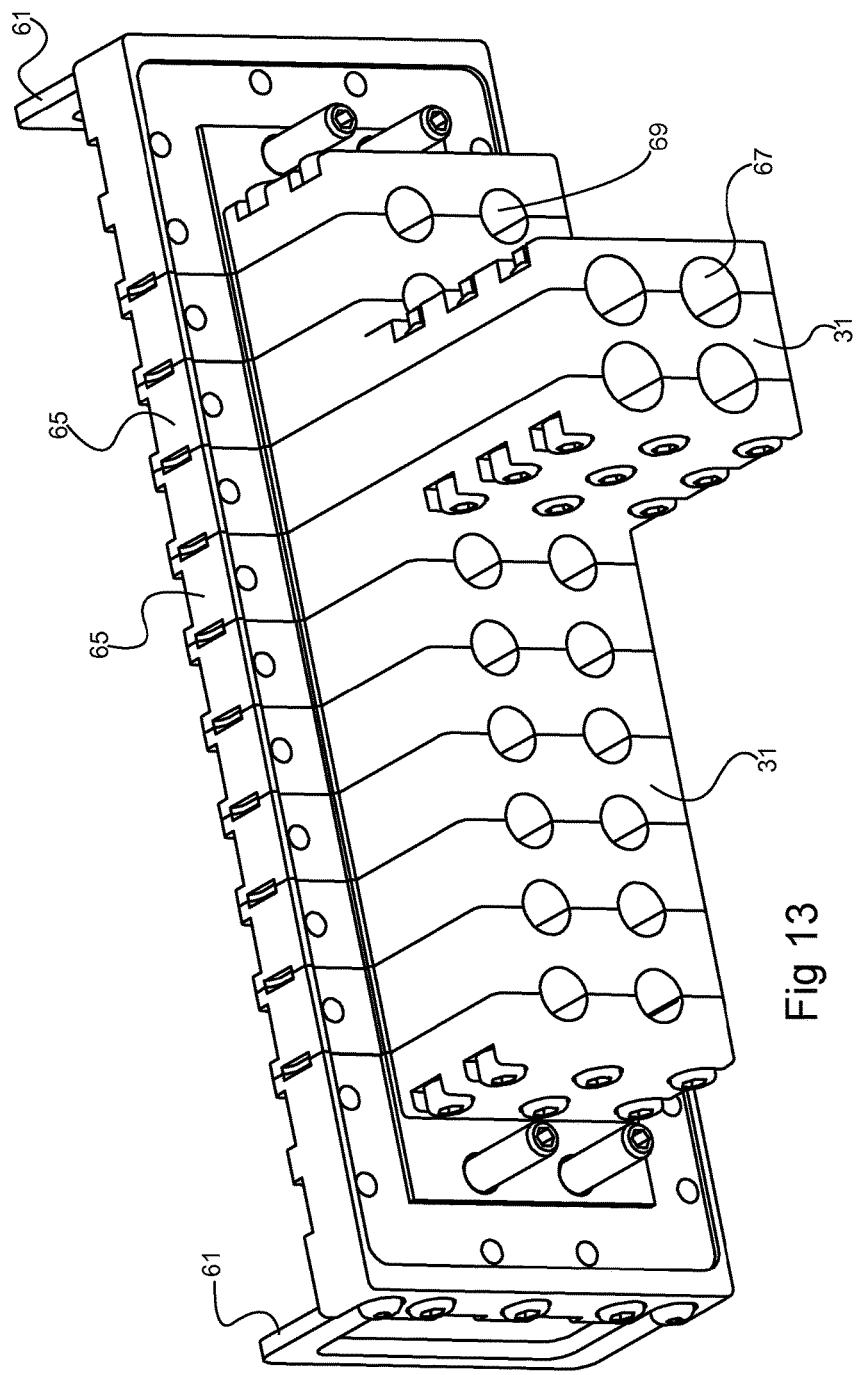
FIG. 13 is a perspective drawing showing another side of an assembly in an embodiment of the invention where the waveguides have different lengths.

FIG. 12 shows an embodiment of the invention in which the waveguides have varying lengths. Varying the length of the waveguides in the same assembly 41 may save space and material. As described above, a waveguide with a larger diameter 67 will need to be longer to achieve a given attenuation than a waveguide with a smaller diameter 69. At the same time, the space for a signal lead given by a large-diameter waveguide may not be needed for all wave-guides in a feed-through. Shown is an assembly 41 with middle parts 31 that form shorter waveguides and middle parts 31' that form longer waveguides. Between middle parts of the two mentioned types, there are transitional parts 65, to which further bolts and nuts can be attached to firmly fasten the parts forming longer waveguides together along the whole length of the waveguides. As in the embodiments depicted in FIG. 10 and FIG. 11, the assembly 41 has handles 61. FIG. 13 shows another side of the same embodiment.

Figure 14:
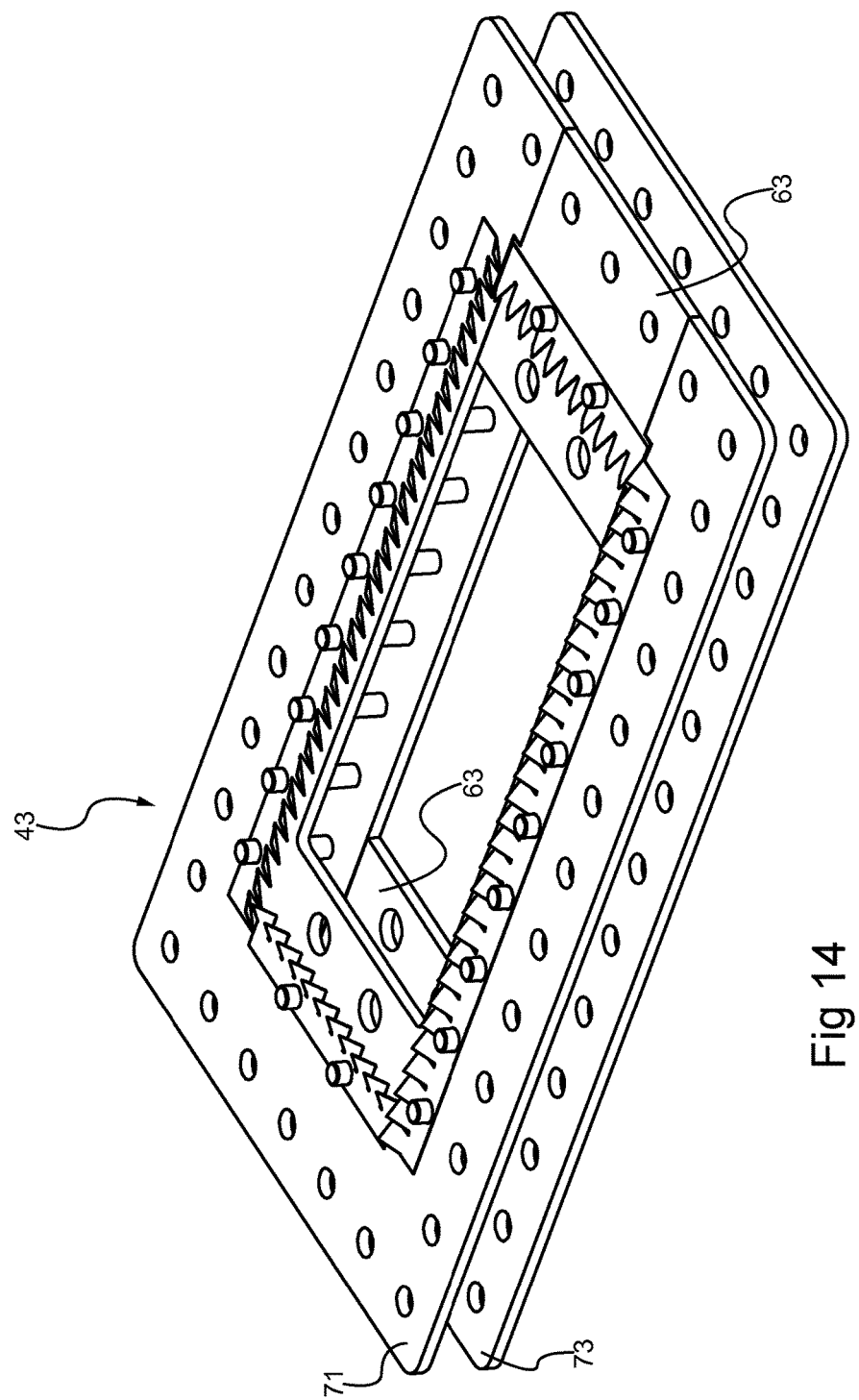
FIG. 14 is a perspective drawing showing a frame in an embodiment of the invention in which the frame has two layers.

FIG. 14 is a perspective drawing showing a frame 43 in an embodiment of the invention in which the frame has two layers 71, 73. Each layer 71, 73 of the frame 43 has a detachable part 63, which may aid installation of the feed-through. In a cabinet having double walls each layer of the frame may be attached to each of the walls. It is also possible to two stacked layers on one side of a single wall, or on either side of a single wall. As the detachable parts are located on opposide sides in the two layers, any electromagnetic leaks can be reduced. Needless to say, more than two layers can be provided.

The present disclosure is not limited by the above example, and may be varied and altered in different way within the scope of the appended claims.

The invention claimed is:

1. A feed-through for providing electromagnetic shielding, comprising:
a frame that comprises an opening; and
an assembly comprising two or more joining parts configured to form one or more elongated waveguides, the joining parts being made of a conductive metal, divisible along a length of the one or more elongated waveguides and capable of surrounding one or more signal leads, wherein the joining parts are configured to be attached to each other, wherein the assembly is configured to be attached to the frame via one or more flanges to allow the one or more signal leads to pass through the opening in the frame and through one of the one or more elongated waveguides, and wherein the opening in the frame has a larger maximum transversal extension than the maximum transversal extension of the one or more elongated waveguides.

2. The feed-through according to claim 1, wherein the joining parts are configured to form two or more elongated waveguides, the opening in the frame providing access to more than one of the two or more elongated waveguides to allow the one or more signal leads to pass through the opening in the frame and through any of the two or more elongated waveguides.

3. The feed-through according to claim 1, wherein the one or more elongated waveguides have a length of at least 52 mm.

4. The feed-through according to claim 1, wherein the one or more elongated waveguides have a maximal transversal extension of at most 17.5 mm.

5. The feed-through according to claim 1, wherein a connecting surface between the two or more joining parts comprises a recess.

6. The feed-through according to claim 1, wherein the one or more elongated waveguides are configured to extend through the opening in the frame.

7. The feed-through according to claim 6, wherein the feed-through is configured to provide electromagnetic shielding when the one or more signal leads pass through a cabinet, the one or more elongated waveguides being configured to extend further on the outside of the cabinet than on the inside of the cabinet.

8. The feed-through according to claim 7, wherein the frame has a thickness of at least 10 mm perpendicular to the plane of one side of the cabinet.

9. The feed-through according to claim 7, wherein the frame is suitable for welding to the cabinet.

10. The feed-through according to claim 1, wherein the frame and the assembly are made from machined parts.

11. The feed-through according to claim 1, wherein the frame and the assembly are made of steel.

12. The feed-through according to claim 1, further comprising an electric contact between the frame and the assembly, the electric contact being secured by a gasket made from a conductive material.

13. The feed-through according to claim 12, wherein the conductive material comprises beryllium-copper.

14. The feed-through according to claim 1, wherein the feed-through is configured to provide electromagnetic shielding when the one or more signal leads pass through a cabinet, and wherein the one or more signal leads comprise a fiber-optic cable.

15. The feed-through according to claim 1, wherein the two or more joining parts and/or the assembly are configured to be connected to the frame via one or more bolts.

16. The feed-through according to claim 15, wherein the two or more joining parts and/or the assembly are further configured to be connected to the frame via one or more nuts.

17. The feed-though according to claim 1, wherein the assembly further comprises a handle.

18. The feed-through according to claim 1, wherein the frame comprises one or more detachable parts.

19. The feed-through according to claim 1, wherein the frame comprises two or more layers.

20. The feed-through according to claim 1, wherein the one or more elongated waveguides have different lengths.

21. The feed-through according to claim 1, wherein the frame comprises two or more openings.

22. The feed-though according to claim 1, wherein the feed-through is configured to provide electromagnetic shielding when the one or more signal leads pass through a cabinet, and wherein the frame comprises a rectangular cross section in a plane of the cabinet when the frame is attached to the cabinet, the opening in the frame being rectangular in cross section in the plane of the cabinet, the two or more joining parts of the assembly comprising two end parts and one or more middle parts between the two end parts, each of the two end parts comprising a flange fitting to two edges along a first major axis of the frame, each of the two end parts further comprising a protruding section at a right angle to the flange, the protruding section of each of the two end parts comprising a first set of one or more cut-outs, the one or more middle parts comprising two flanges fitting to two edges along a second major axis of the frame, the one or more middle parts further comprising a protruding section at a right angle to the two flanges, the protruding section of the middle parts comprising a second set of one or more cut-outs on both sides that face other joining parts, the first and second sets of cutouts forming the one or more elongated waveguides.

23. The feed-through according to claim 22, wherein the one or more middle parts are of two types, one type including a hole with threads fitting a bolt that is used to connect the joining parts and/or the assembly to the frame, the other type including a hole without threads.

24. A system, comprising:
a feed-through, the feed-through comprising:
an frame that comprises an opening; and
an assembly comprising two or more joining parts configured to form one or more elongated waveguides, the joining parts being made of a conductive metal, divisible along a length of the one or more elongated waveguides and capable of surrounding one or more signal leads, wherein the joining parts are configured to be attached to each other, wherein the assembly is configured to be attached to the frame via one or more flanges to allow the one or more signal leads to pass through the opening in the frame and through one of the one or more elongated waveguides, and wherein the opening in the frame has a larger maximum transversal extension than the maximum transversal extension of the one or more waveguides;
an enclosure suitable for electromagnetic shielding; and
one or more signal leads.

* * * * *